United States Patent [19]

Sieron

[11] Patent Number: 4,786,862

[45] Date of Patent: Nov. 22, 1988

[54] WATCHDOG CIRCUIT FOR TRANSMISSION LINE SENSOR MODULE

[75] Inventor: Richard L. Sieron, Fairfield, Conn.

[73] Assignee: Niagara Mohawk Power Corporation, Syracuse, N.Y.

[21] Appl. No.: 872,011

[22] Filed: Jun. 9, 1986

[51] Int. Cl.$^4$ .................. G01R 15/04; G06F 11/00
[52] U.S. Cl. ............................... 324/126; 324/127; 371/14
[58] Field of Search ............ 324/127, 126, 110, 142, 324/73 R; 364/483; 371/14; 361/71, 92

[56] References Cited

U.S. PATENT DOCUMENTS

| | | | |
|---|---|---|---|
| 2,885,146 | 5/1959 | Speh | 324/73 R |
| 4,359,684 | 11/1982 | Ley | 324/142 |
| 4,584,645 | 4/1986 | Kosak | 371/14 |

*Primary Examiner*—Ernest F. Karlsen
*Attorney, Agent, or Firm*—Lalos & Keegan

[57] ABSTRACT

A self contained sensor module mounted on a power transmission line. The module is capable of measuring various parameters such as line current, voltage, conductor temperature, and ambient temperature. The parameter values are processed by sensor electronics which digitize and periodically transmit the values to a ground receiver. The sensor electronics include MOS integrated circuits which are sensitive to fluctuations in supply voltage and which may enter a power-fail state or latch up as a result of such fluctuations. The module contains watchdog circuitry which monitors the operation of the module. If an interruption in the module's normal operating sequence occurs, the watchdog circuit resets the MOS integrated circuits by initiating a power down/power up sequence. The module further includes current limiting circuitry that reduces the integrated circuit's supply voltage in response to the failure of a circuit that is not critical to the module's normal operating sequence.

9 Claims, 9 Drawing Sheets

WATCHDOG CIRCUIT FOR TRANSMISSION LINE SENSOR MODULE

CROSS-REFERENCE TO RELATED APPLICATIONS

This application is related to copending applications Ser. No. 484,681, filed Apr. 13, 1983, now U.S. Pat. No. 4,689,752, Ser. No. 564,924, filed Dec. 23, 1983, now U.S. Pat. No. 4,635,055, Ser. No. 669,589, filed Nov. 8, 1984, Ser. No. 795,167, filed Nov. 5, 1985, and Ser. No. 795,226, filed Nov. 5, 1985.

BACKGROUND OF THE INVENTION

This invention relates to apparatus for measuring operating parameters of a high voltage power conductor. More particularly, it relates to a radio transmitting sensor which are mounted on the transmission lines. The sensors normally derive their power through electromagnetic induction using the magnetic field generated as a result of current flowing through the transmission line conductor. Transmission line sensors of the above type are disclosed in the U.S. Pat. No. 4,384,289, of Howard R. Stillwell and Roosevelt A. Fernandes entitled Transponder Unit for Measuring Temperature and Current on Live Transmission Lines, issued May 17, 1983, which patent is incorporated herein by reference.

Various power line sensors have been disclosed in the prior art. For example, see U.S. Pat. Nos. 3,428,896, 3,633,191, 4,158,810 and 4,268,818. Sensors of this type and of the improved form disclosed in the above-identified Stillwell and Fernandes patent have been proposed for dynamic line rating of electrical power transmission lines.

The power line sensor available in the prior art measure quantities associated with operation of the overhead line such as voltage on the conductor, current flow in the conductor, conductor temperature and ambient temperature. The information gathered is transmitted to a local ground station. Data from various ground receivers is transmitted to a central control station where the information is analyzed. Based on this analysis, the entire power system is controlled with power being supplied to the various transmission lines in accordance with their measured parameters.

The compact toroidal-shaped sensor modules, disclosed in U.S. Pat. No. 4,384,289 and in the prior copending applications referenced above, contain the sensor electronics, power supply and transmitter circuits, and hardware for attaching the sensors to the transmission lines. Under normal operating conditions, power for the sensor module is derived from the transmission line conductor and converted into regulated supply voltages for the sensor electronics and transmitter. However, the harsh environment of power transmission lines subjects the sensor module to power supply fluctuations due to a variety of transient line conditions. The module electronics include a number of metal-oxide-semiconductor (MOS) integrated circuits. These circuits are sensitive to variations in supply voltage and may enter a power-fail state or may be locked into an inoperable state if the sensor module experiences a power fluctuation or some other abnormal operating event.

In accordance with the present invention, the transmission line sensor module is provided with an operation monitoring circuit, often called a watchdog circuit. The watchdog circuit prevents the sensor module from being locked in an inoperable state after the occurrence of a transient event that adversely effects the MOS integrated circuits. The circuitry of the present invention senses a condition that indicates the integrated circuits are operating in an abnormal mode. In response to this sensed condition, the supply voltage to the circuits is shut off for a predetermined time period and then turned back on. This feature effectively resets the integrated circuits to a known operational state thereby permitting a normal operational sequence to begin.

It is also possible that a non-critical integrated circuit will enter a power-fail state without affecting the operating sequence of the module in a manner that is easily detectable. In this situation, the MOS integrated circuit in a power-fail state will draw excess power. The present invention includes current limiting circuitry which reduces the supply voltage to the integrated circuits when a failed circuit attempts to draw excess power. Thus the current limiting circuitry functions as a secondary watchdog circuit since the reduced voltage will effectively reset all the integrated circuits, including the circuit in a power-fail state.

It is therefore an object of the invention to provide a transmission line sensor module which can continue to operate after the occurrence of a transient line condition or interrruption in the normal operating sequence.

Another object is to provide a watchdog circuit which monitors the module's operation to detect a variation in the normal operating sequence.

A further object of the invention is to provide monitoring circuitry that is responsive to detection of an abnormal operating sequence of resetting the module's integrated circuits.

Another object of the invention is to provide circuitry which resets the module's electronics to a known operational state by shutting off power to the electronics and subsequently turing power back on.

Still another object of the invention is to reset the module's electronics in the event that an individual integrated circuit enters power-fail mode without altering the normal operating sequence of the sensor modules.

DETAILED DESCRIPTION

The transmission line sensors embodying the present invention monitor a variety of conductor parameters. Each sensor is equipped to measure line current, line to neutral voltage, frequency, phase angle, conductor temperature, and ambient temperature. The values of the monitored parameters are fed to a central location which uses the information to control an entire transmission system.

Figure 1:
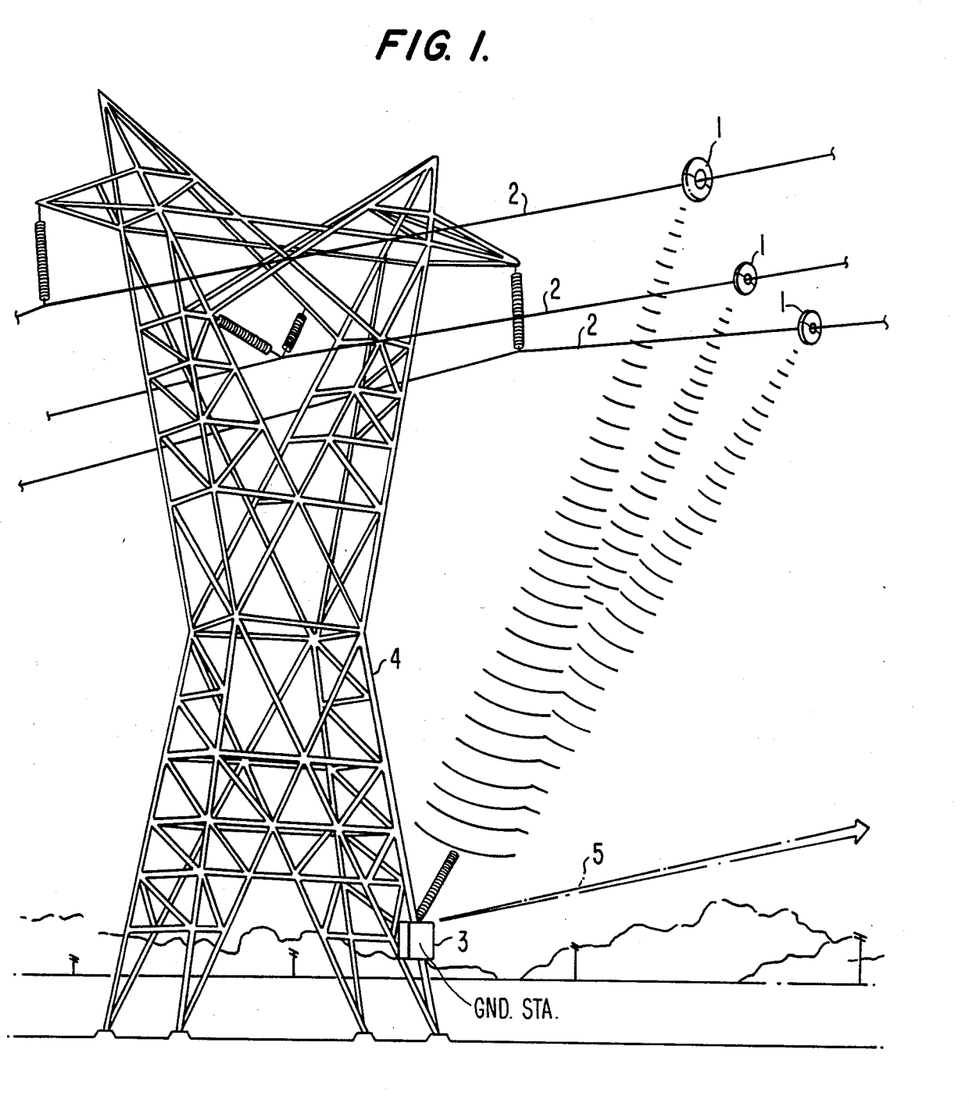
FIG. 1 is a view of several sensor modules attached to the three phase conductors of an electric power line and apparatus for transmitting the measured parameters.

FIG. 1 illustrates several sensors 1 mounted on power conductors 2. Each sensor includes electronics which process and digitize the parameter values and assemble the digital data into appropriate encoded messages. Sensor module electronics include a microprocessor, RAM,I/O, and timer components as disclosed in co-pending application Ser. No. 484,681. The digital data is transmitted by the senor modules 1 to a local ground station 3 which may be mounted on an electrical transmission tower 4. The digital data transmitted, typically once a second, by means of a 950 MHz FM radio link in a 16 millisecond burst.

Ground station 3 includes a microprocessor which further processes the data. For example, data received from the 3 phase set of FIG. 1 can be used to calculate power parameters such as total circuit kilowatts, kilovars, and voltamps. The ground station 3 includes provisions of conversion of data to the form and parameters required by the central station.

Ground station 3 transmits its data to a central monitoring host computer, typically once a second, over data link 5 (e.g. radio, land lines, or satellite channels). The measured data is then processed by the control computer which issues appropriate control signals over other transmission links to switchgear at electrical substations. Thus, the power supply to transmisson lines may be varied in accordance with their measured temperature and electrical parameters.

Figure 2:
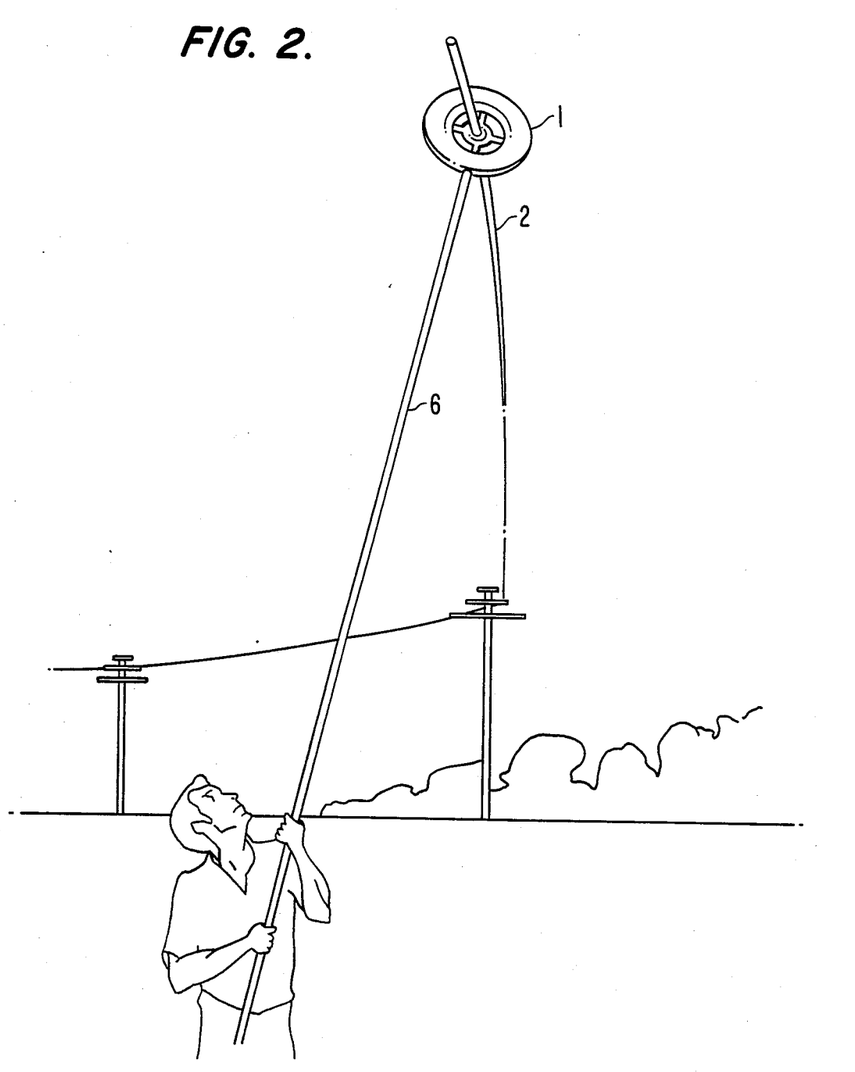
FIG. 2 is a view of a permanent or semi-permanent sensor module embodying the present invention being mounted on a transmission line.

The sensor modules can be placed throughout the power transmission system to monitor line characteristics and ensure effective reliable system control. As illustrated in FIG. 2, the modules 1 can be easily and quickly mounted on a line conductor 2 using a "hot stick" 6.

The size, shape, and operating characteristics of the sensor modules enable its use in a wide variety of conditions and situatons. Each module is relatively small and shaped like a donut, with a $12\frac{5}{8}''$ major diameter and a maximum thickness of $4\frac{3}{4}''$. It weighs approximately 18 pounds. Environmental operating conditions include: ambient air temperature range of $-40°$ C. to $+45°$ C.; driving rain, sleet, snow, and ice buildup, falling ice from overhead conductors, sun loading; and vibrations of conductors 2. All electronics within the module are sealed in water-tight compartments, and the module is protected against lightning surges by MOV devices and proper grounding and shielding. All exterior surfaces are rounded and free from sharp edges so as to prevent corona.

Figure 3:
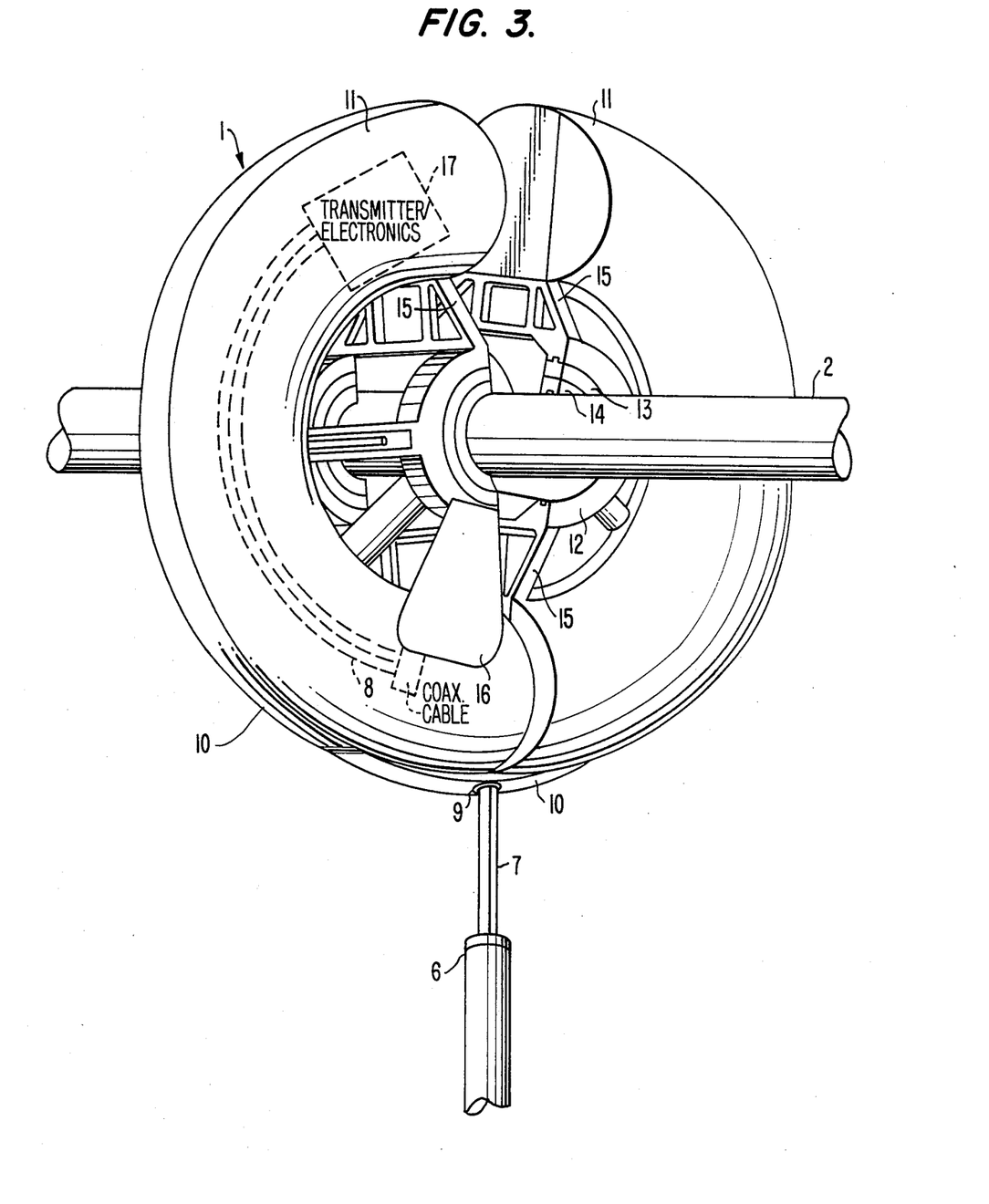
FIG. 3 is a perspective view showing the sensor module being mounted on an energized conductor.
Figure 4:
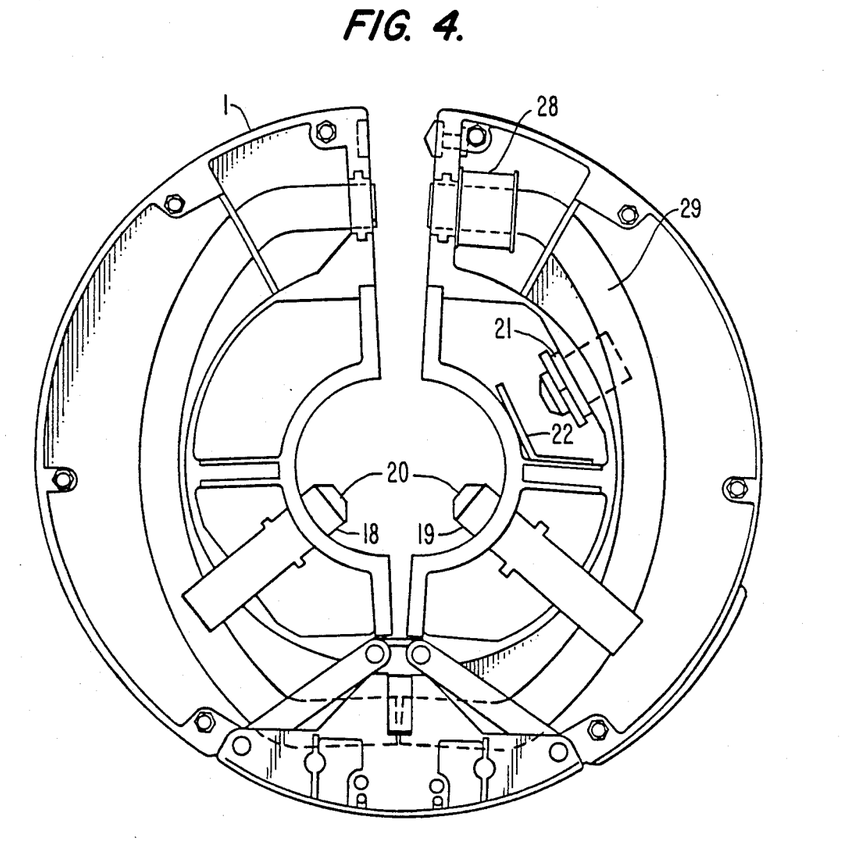
FIG. 4 is a cross section view of a sensor module.

FIGS. 3 and 4 illustrate the configuration of the sensor module's exterior and interior, respectively. As shown in FIG. 3, the module contains two lower sections 10 and two covers or upper sections 11, held together by six bolts (not shown). Each lower section 10 is provided with a top hub 13 and a bottom hub 14, supported by three open radial webs 15. The sensor housing, generally indicated at 1, is secured to a clamping jaws assembly 12 by the open radial webs 15. The diameter of the internal opening of the assembly is variable and is selected for each specific application. The assembly diameter can be chosen to accommodate different power cables from 0.5" to 2" in diameter. An R.F. impedance matching network 16, mounted near assembly 12, is connected via coaxial cable parts 8 to a shielded transmitter and electronics shown generally at 17 inside module 1.

Also shown in FIG. 3 is a hot stick tool with an Allen wrench portion 7 which fits within a hole 9 in module 1 mounted on conductor 2. With the hot stick tool 6 inserted into module 1, the hot stick is turned in one direction to cause the module to split so that it can be placed over a conductor. Turning the hot stick in the opposite direction causes the module to close over the conductor and clamp onto it tightly. The tool 6 can then be removed by simply pulling it away. Reinsertion and turning will open the module and allow it to be removed from the transmission line. This placement/removal feature provides great flexibility in locating the modules in the power transmission system.

FIG. 4 illustrates the sensor components which measure the temperature parameters of the transmission line. The temperature of the transmission line is measured by conductor temperature probes 18 and 19. These probes are spring loaded against the conductor when the module is installed. The contacting tip 20 is beryllia and inhibits corrosion and yet conducts heat efficiently to the temperature transducer within. It is a non-conductor of electricity so as not to create a low resistance path from the conductor to the electronics. An ambient probe 21 is provided with a shield 22 covering the hub area so that the probe measures the temperature of the air rather than the temperature of the conductor. The hub and spoke area in the center of the module and the temperature probe placement are designed with as much free space as possible so as not to affect the temperature of the conductor.

Figure 5:
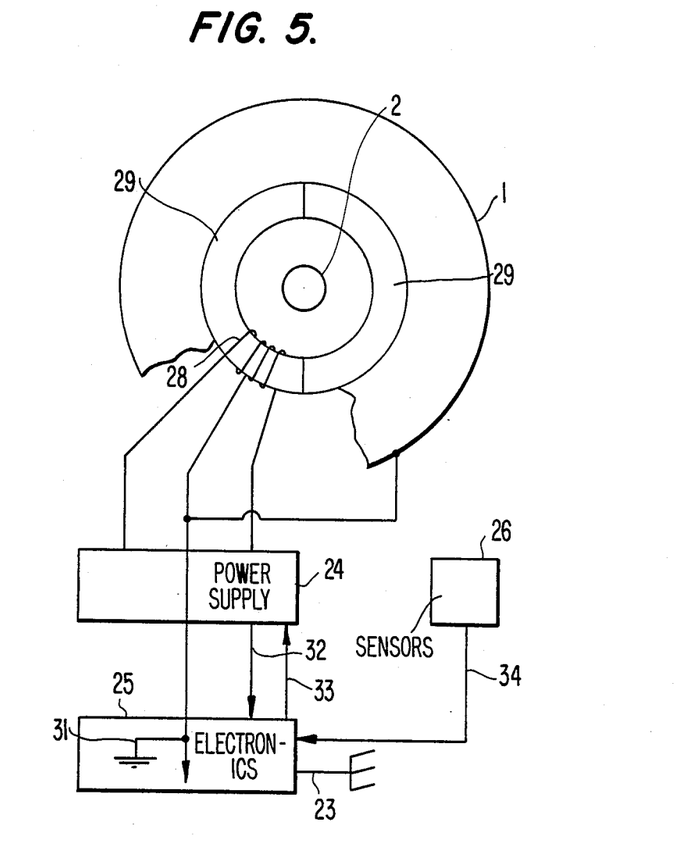
FIG. 5 is a general block diagram of the power supply system and electronics of a sensor module.

FIG. 5 illustrates the electronics of sensor module 1 in their overall configuration. They comprise a power supply 24, digitizing and transmitting electronics 25, sensors 26, and antenna 23.

Power to operate the sensor module electronics is normally derived from winding 28 on a laminated iron core 29 which surrounds line conductor 2. This core is split to accommodate the opening of the module when it clamps around the conductor. The power supply 24 supplies regulated +5 and −5 volts to the electronics 25 and +12 volts for the transmitter as indicated at 32. Local ground is indicated at 31. The electronics 25 provide a transmitter control signal on line 33 to control the power supply to the transmitter. The sensors 26 provide analog signals indicated at 34 to the electronics 25. A detail schematic diagram of power supply 24 as illustrated in FIGS. 7a and 7b.

Figure 6:
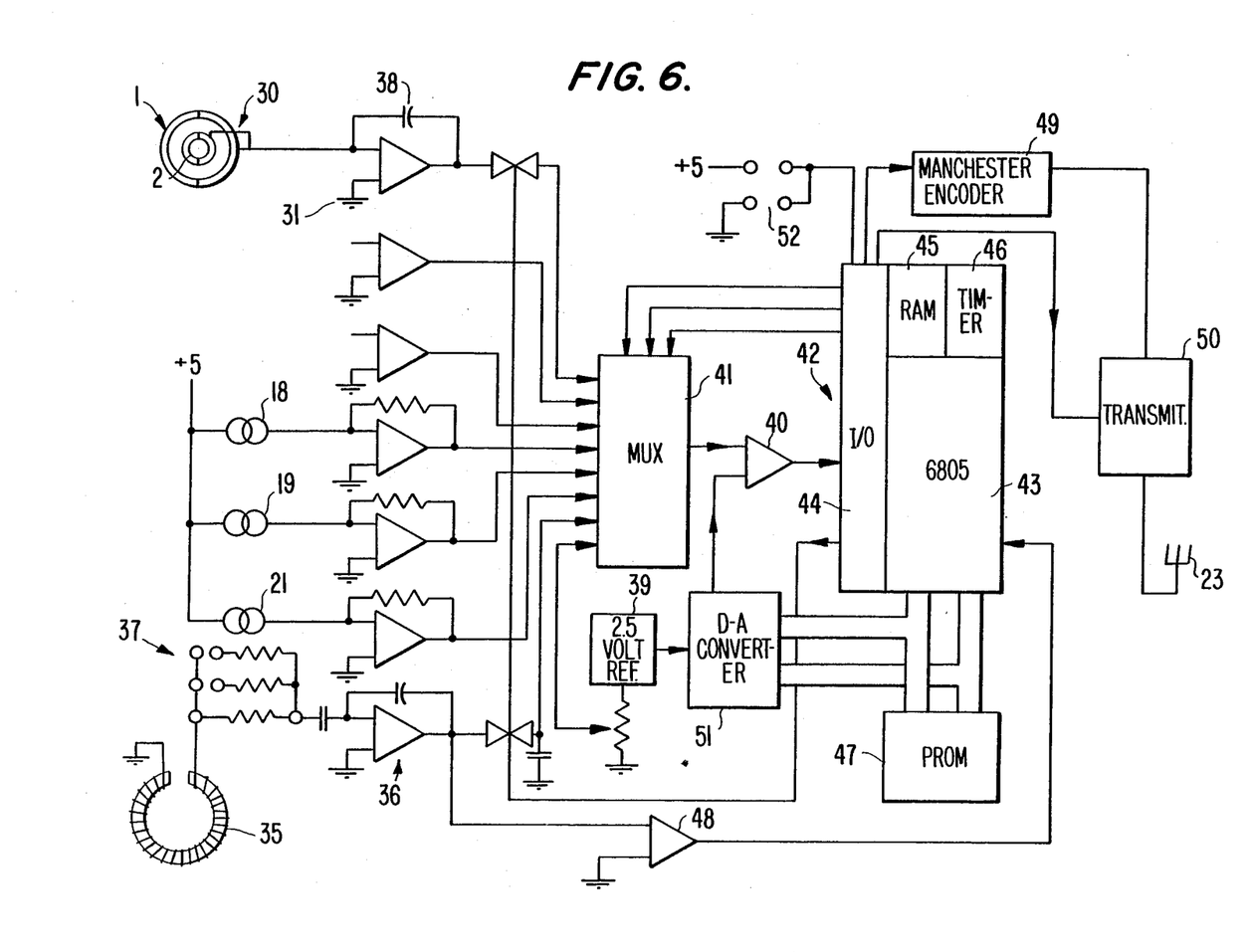
FIG. 6 is a block diagram of the electronics of the sensor module.

FIG. 6 is a block diagram of the electronics 25. Conductor current is measured by the Rogowski coil 35 which is connected to one of a plurality of input amplifiers 36 through current range select resistors 37. Voltage sensing apparatus consisting of the housing and insulated hub generally indicated at 30 is connected to the uppermost amplifier which is provided with a capacitor 38 in the feedback circuit which sets gain and provides an amplifier output voltage in phase with line to neutral high tension voltage. It also provides integrator action for the measurement of current the same way as the amplifier connected to the Rogowski coil. Thus amplifier 36 connected to the voltage sensing apparatus 30 is a low impedance current measuring means connected between the power conductor 2 and insulated hub portions 13 and 14 (FIG. 3).

Each of the temperature transducers 18, 19, and 21 is connected to a separate one of the amplifiers 36 as shown. Spare amplifiers are provided for measurement of additional characteristics such as the interior temperature of module 1. Each of the amplifiers 36 is connected for comparison with the output of digital-to-analog converter 51 from 2.5 volts reference source 39 at comparator 40 by the multiplexer 41 under control of the digital computer 42. The digital computer may be a Motorola CMOS 6805 microprocessor 43 having I/O 44, RAM 45 and timer components 46. A programmable read only memory 47 is connected thereto storing the program. A zero crossing detector 48 detects the zero crossings of the voltage or current in the Rogowski coil 35 and provides basic synchronization. A module ID number is selected by jumpers generally indicated at 52. The digitized data assembled into an appropriate message is encoded in Manchester code by the encoder 49 and supplied to a 950 MHz transmitter 50 which then supplies it to the antenna 23. A detailed schematic diagram of the electronics is disclosed in copending application Ser. No. 484,681.

Figure 7A:
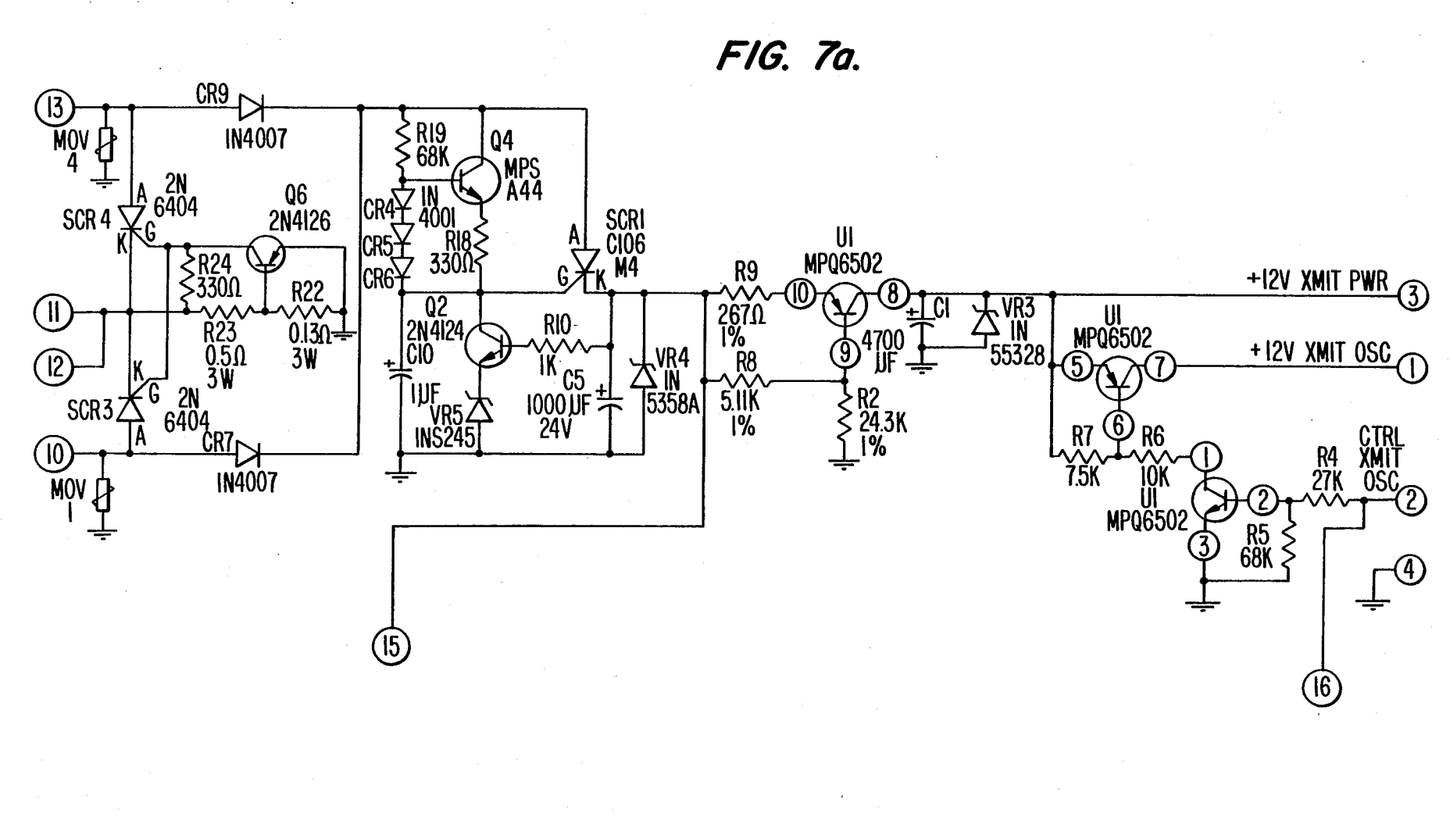
FIG. 7a is a schematic diagram illustrating the transmitter section of the power supply.
Figure 7B:
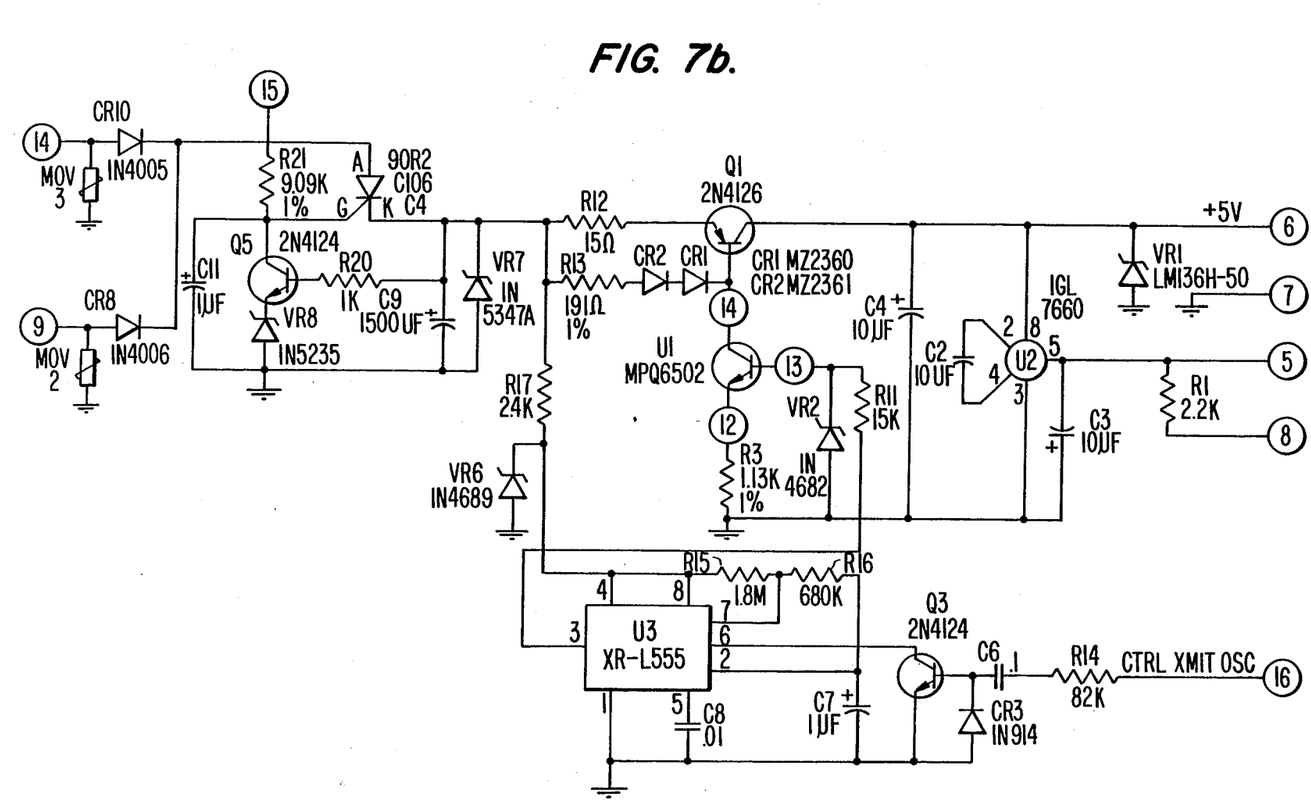
FIG. 7b is a schematic diagram illustrating the logic section of the power supply.

FIGS. 7a and 7b illustrate the power supply circuitry of the sensor module. It includes two supply sections—a first section (FIG. 7a) to provide regulated +12 volts DC for the module's transmitter and transmitter oscillator, and a second section (FIG. 7b) to provide regulated +5 volts DC for the module's digital circuits and −5 volts DC for the module's analog circuits. Referring to FIG. 7a, terminal points 10 and 13 are connected to winding 28 (FIG. 5) and terminal points 11 and 12 are connected to the winding center tap. Terminal point 3 in FIG. 7a is connected to the transmitter and terminal point 1 is connected to the transmitter oscillator. Power for the transmitter oscillator is turned on and off by a control signal (CTRL XMIT OSC) from the module's processor. This signal is shown in FIG. 7a as coming in at terminal point 2. The processor generates this transmit signal typically once per second for a period of about 16 ms. This signal, when generated by the processor, turns on transistors which gate the 12 volt supply power to the transmitter oscillator. When the transmission line sensor is operating normally the transmit control signal will be generated once per second to transmit the sensor data to a remote ground station. Referring to FIG. 7b, the transmit control signal is shown coming into the logic section of the power supply at terminal point 16. Terminal points 9 and 14 in FIG. 7b are connected to winding 28 (FIG. 5). Terminal point 6 connects to the digital logic circuits and terminal point 5 connects to the analog circuits.

Figure 8:
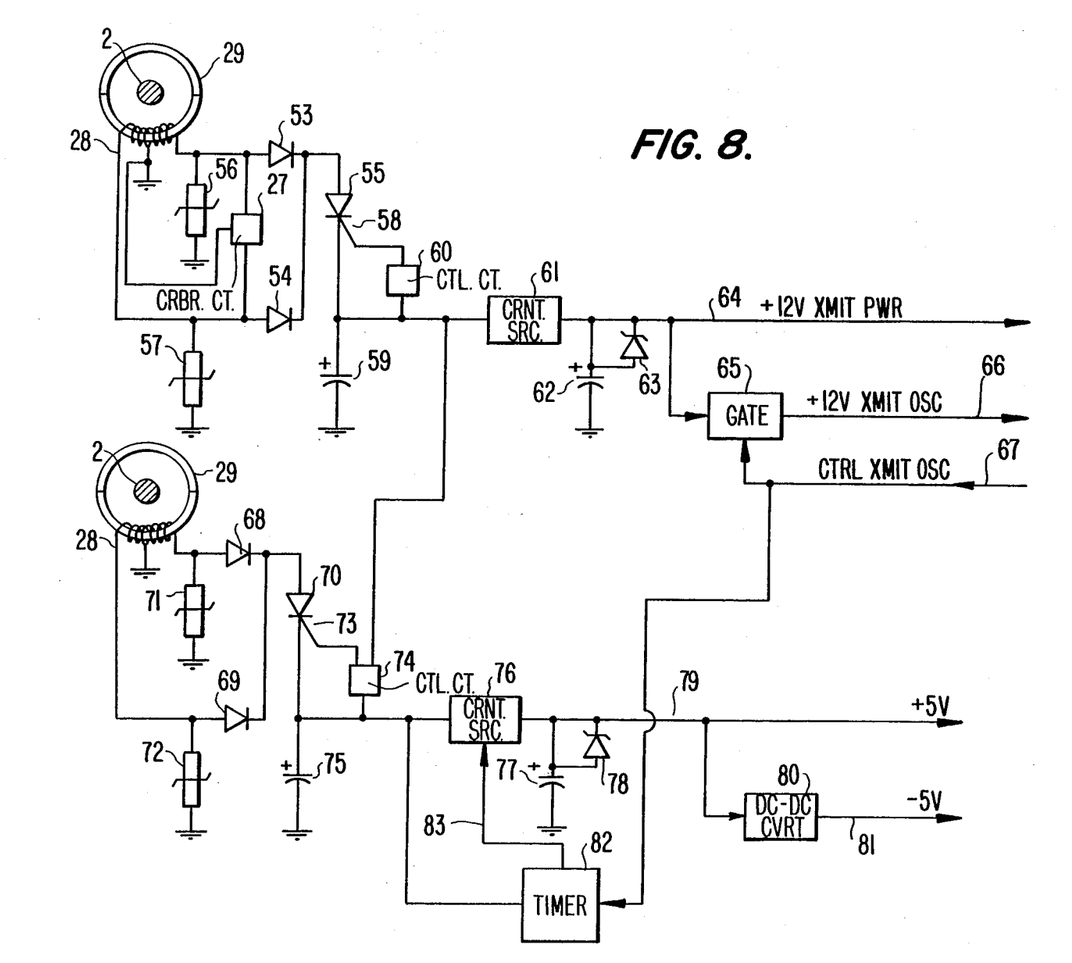
FIG. 8 is a block diagram of the power supply and watchdog circuitry of the present invention.

FIG. 8 is a block diagram of the power supply including the watchdog circuitry of the present invention. During typical sensor module operation, power is derived through electromagnetic induction using the magnetic field generated as a result of current flowing through conductor 2. The hinged iron core transformer with the line conductor forming the single turn primary supplies all internal power to the sensor module. Current in conductor 2 induces voltage and current in winding 28 on iron core 29.

In the transmitter power supply section (upper half of FIG. 8), current in winding 28 is rectified by diodes 53 and 54 producing a full wave rectified wave form at the anode of silicon controlled rectifier (SCR) 55. Protection against power surges is provided by MOV devices 56 and 57 and crowbar circuit 27. SCR 55, with its gate 58 controlled by control circuit 60, produces approximately +13 volts raw DC at capacitor 59. The raw DC is delivered to a constant current source 61 which, with zener diode 63, regulates the raw DC to produce a constant voltage of +12 volts DC across capacitor 62. The 12 volts DC is supplied on line 64 to power the transmitter. The +12 volts DC is also supplied to the transmitter oscillator on line 66 through gate 65. Gate 65 is controlled by the CTRL XMIT OSC signal on line 67 which is generated by the sensor module's processor. The processor generates this signal during normal operation to initiate transmissions to the ground station. This transmit control signal is typically generated once per second for a period of 16 ms to power the transmitter oscillator.

The logic section of the power supply (lower half of FIG. 8), similar to the transmitter section, includes diodes 68 and 69. These diodes rectify the current in winding 28 to produce a full wave rectified wave form at the anode of SCR 70. MOV devices 71 and 72 provide power surge protection. SCR 70, with its gate 73 controlled by control circuit 74, produces approximately +6.5 volts raw DC at capacitor 75. This raw DC is delivered to constant current source 76 which, with zener diode 78, regulates the raw DC to produce a constant voltage of +5 volts across capacitor 77. This regulated +5 volts is delivered to the module's digital logic circuits and to DC-DC converter 80 on line 79. The DC—DC converter 80 converts the +5 volts to −5 volts which is delivered to the module's analog circuits on line 81.

The watchdog circuitry of the present invention comprises timer circuitry shown generally in FIG. 8 as block 82, and the constant current source shown generally as block 76. The constant current source 76, shown in detail in FIG. 7b, also functions as a current limiter for the +5 volt supply. Circuit 76 limits the output current to approximately 40 ma.

As mentioned previously, the sensor module's digital logic circuits comprise metal-oxide-semiconductor (MOS) integrated circuits. These MOS circuits include the processor, memory, and I/O control circuits. Under normal module operating conditions, i.e. with power being supplied by the transmission line and regulated by the power supply circuits, +5 volts DC is being constantly supplied to the MOS integrated circuits of the module. However, sudden changes in the +5 volt supply, e.g. due to a power disturbance or transient line condition, can cause the MOS circuits to enter a power-fail state. These circuits may be locked in this inoperable state until they are powered down and then powered back up. This power-down/power-up sequence is necessary to reset the integrated circuits to a preset condition so that a normal operating sequence can be started.

The watchdog circuitry of the present invention provides a novel solution to the problem presented by the MOS integrated circuits. The watchdog circuitry includes timer circuitry shown generally as block 82 in FIG. 8 and shown in detail in FIG. 7b. As shown in FIG. 8, timer circuitry 82 receives the transmitter control signal (CTRL XMIT OSC) generated by the module's processor. When the module is operating properly, this transmitter control signal is generated once every second for a duration of approximately 16 ms to transmit the sensor data to a remote station. Thus, the periodic generation of the transmitter control signal is an indication that the module is operating normally.

The output of timer circuit 82 shown as line 83 in FIG. 8. This output line is always on (high) during normal module operation and is used to enable the constant current source circuit 76. However, timer circuit 82 is configured to turn off output line 83 for a preset time period in response to an indication that the module is not operating properly. When output line 83 goes off, the current source circuit 76 is disabled and the +5 volt source for the integrated circuits is shut off.

Referring to the detailed schematic of the timer circuit in FIG. 7b, the on/off characteristics of timer U3 are determined in part by resistor R16 and capacitor C7. Pin 3 on timer U3 is the output line and is normally high. However, if capacitor C7 is allowed to charge up (which normally takes about 2 seconds), timer U3 will cause pin 3 to go low (for ½ second) and then go back to the high state (for 2 seconds). This, in effect, shuts off the +5 volt supply for ½ second and then turns it back on, thus resetting the integrated circuits. The timer U3 will continue to cause pin 3 to go low for ½ second and then high for 2 seconds as long as capacitor C7 is allowed to charge up. Thus, the power down/power up sequence will be repeated until the module's normal operating sequence is resumed.

However, as previously discussed, when the sensor module is operating normally, the processor will generate the transmitter control signal (CTRL XMIT OSC) once per second. Referring to FIG. 7b, when the transmitter control signal is generated, it turns on transistor Q3 thereby shorting capacitor C7. Thus, during normal module operation, capacitor C7 never charges up, the timer U3 on/off sequence is never initiated, and the +5 volt supply remains on. If however, the MOS integrated circuits go into a power-fail state or latch up for any reason, the processor will fail to execute the normal operating sequence and will fail to generate the transmitter control signal. Absence of the periodic transmitter control signal will automatically initiate the power down/power up sequence and reset the integrated circuits. An additional advantage of the watchdog circuit of the present invention is that if the module's processor gets locked in a software loop for any reason and the transmitter control signal is not generated, the watchdog circuit will cause the processor to be reset.

A secondary watchdog circuit is provided by the current limiting feature of constant current source circuit 76 (FIG. 8). It is possible that one or more of the modules's integrated circuits could enter a power-fail state or latch-up in an inoperable condition without affecting the normal operating sequence of the processor. Therefore, the transmitter control signal could still be generated even though a non-critical circuit was inoperative. However, a MOS integrated circuit in a power-fail or latched state will attempt to draw excess power. Since the output current of circuit 76 is limited, the failed circuit will cause the +5 supply voltage to drop. This drop in supply voltage will have the effect of resetting the MOS integrated circuits, including the failed circuit. Resetting the module's circuits to a known "start-up" state allows the normal operating sequence to begin.

From the foregoing description, it can be seen how the present invention overcomes the disadvantages of using MOS integrated circuits in an environment subject to power fluctuations.

The watchdog circuitry provides a novel, effective means for monitoring the operating state of the sesor module.

The watchdog circuitry further provides a novel means for resetting the module's integrated circuits when an abnormal operating condition is sensed. The timer circuitry of the preset invention controls the power supply to the MOS integrated and ensure the proper power-down, power-up sequence required to reset the circuitry.

In addition, the current limiting feature of the present invention ensures that the sensor module will be reset even if a non-critical circuit becomes inoperative.

I claim:

1. A device for monitoring at least one parameter of a power transmission line for transmitting alternating current comprising:
   means for sensing values of said parameters;
   means coupled to said sensing means for processing said values;
   memory means coupled to said processing means for storing said processed values;
   means for deriving energy from said transmission line for powering said device;
   means coupled to said means for deriving energy from said transmission line for converting alternating current into direct current;
   means coupled to said means for converting for supplying power to said processing means and said memory means;
   means for controlling said means for supplying power to said processing means and said memory means;
   said means for controlling including means for receiving a periodic signal indicating normal device operation and being responsive to said periodic signal for continuously enabling said means for supplying power to supply power to said processing means and said memory means; and
   said means for controlling further including means responsive to sustained absence of said periodic signal indicating abnormal device operation for disabling said means for supplying power to said processing means and said memory means for a fixed time period and for subsequently enabling said means for supplying power to said processing means and said memory means; whereby
   said processing means and said memory means are powered down and subsequently powered up following an indication of abnormal device operation.

2. A device as defined in claim 1 wherein said periodic signal indicating normal device operation is generated by said processing means.

3. A device as defined in claim 2 further including a transmitter and wherein said periodic signal is generated by said processing means to enable said transmitter to transmit said processed values.

4. A device as defined in claim 1 wherein said means for controlling includes timing means for repeatedly disabling said means for supplying power and subsequently enablng said means for supplying power until said periodic signal is received by said means for controlling.

5. A device as defined in claim 4 wherein said timing means disables said means for supplying power for a first time period and enables said means for supplying power for a second time period.

6. A device as defined in claim 1 wherein said processing means and said memory means comprise MOS integrated circuits and said device further includes integrated circuits in addition to said processing means and said memory.

7. A device as defined in claim 6 wherein said means for supplying power further includes means for limiting current supplied to said integrated circuits.

8. A device as defined in claim 7, wherein at least one of said integrated circuits can become inoperative without preventing generation of said periodic signal.

9. A device as defined in claim 8 wherein said current limiting means is responsive to said integrated circuit becoming inoperative for reducing the power supplied to each of said integrated circuits included in said device.

* * * * *